(12) United States Patent
Higuchi et al.

(10) Patent No.: US 7,247,551 B2
(45) Date of Patent: *Jul. 24, 2007

(54) SUBSTRATE FOR ELECTRONIC DEVICE, METHOD FOR MANUFACTURING SUBSTRATE FOR ELECTRONIC DEVICE, AND ELECTRONIC DEVICE

(75) Inventors: Takamitsu Higuchi, Matsumoto (JP); Setsuya Iwashita, Nirasaki (JP); Hiromu Miyazawa, Toyoshina-machi (JP)

(73) Assignee: Seiko Epson Corporation, Tokyo (JP)

( * ) Notice: Subject to any disclaimer, the term of this patent is extended or adjusted under 35 U.S.C. 154(b) by 115 days.

This patent is subject to a terminal disclaimer.

(21) Appl. No.: 10/968,957

(22) Filed: Oct. 21, 2004

(65) Prior Publication Data

US 2005/0079735 A1    Apr. 14, 2005

Related U.S. Application Data

(62) Division of application No. 10/303,955, filed on Nov. 26, 2002, now Pat. No. 6,822,302.

(30) Foreign Application Priority Data

Nov. 28, 2001 (JP) ............................. 2001-362742

(51) Int. Cl.
 *H01L 21/44* (2006.01)
(52) U.S. Cl. .................... 438/607; 438/3; 438/608; 438/778
(58) Field of Classification Search ............ 438/3, 438/778; 257/410
See application file for complete search history.

(56) References Cited

U.S. PATENT DOCUMENTS 5,135,906 A * 8/1992 Harada et al. .............. 505/237

(Continued)

FOREIGN PATENT DOCUMENTS

JP    A 2001-122698    5/2001

(Continued)

OTHER PUBLICATIONS

Higuchi et al. (JP-2001-122698) (Aug. 2001) (Translation).*

(Continued)

*Primary Examiner*—Zandra V. Smith
*Assistant Examiner*—Khanh Duong
(74) *Attorney, Agent, or Firm*—Oliff & Berridge, PLC (57) ABSTRACT

The invention provides a substrate for an electronic device including a conductive oxide layer which is formed by epitaxial growth with cubic crystal (100) orientation or pseudo-cubic crystal (100) orientation and which contains a metal oxide having a perovskite structure, a method for manufacturing a substrate for an electronic device, and an electronic device provided with such a substrate for an electronic device. A substrate for an electronic device includes a Si substrate, a buffer layer which is formed by epitaxial growth on the Si substrate and which contains a metal oxide having a NaCl structure, and a conductive oxide layer which is formed by epitaxial growth with cubic crystal (100) orientation or pseudo-cubic crystal (100) orientation on the buffer layer and which contains a metal oxide having a perovskite structure. The Si substrate is preferably a (100) substrate or a (110) substrate from which a natural oxidation film is not removed. The buffer layer preferably has an average thickness of 10 nm or less.

8 Claims, 8 Drawing Sheets

U.S. PATENT DOCUMENTS

| | | | |
|---|---|---|---|
| 5,225,031 A | | 7/1993 | McKee et al. |
| 5,589,284 A | * | 12/1996 | Summerfelt et al. ......... 428/697 |
| 5,866,238 A | * | 2/1999 | Takayama et al. ........... 428/209 |
| 6,060,735 A | | 5/2000 | Izuha et al. |
| 6,113,690 A | | 9/2000 | Yu et al. |
| 6,674,633 B2 | * | 1/2004 | Sun et al. .................... 361/311 |
| 6,756,139 B2 | * | 6/2004 | Jia et al. ...................... 428/701 |
| 6,960,539 B2 | * | 11/2005 | Higuchi et al. .............. 438/778 |
| 2001/0013313 A1 | | 8/2001 | Droopad et al. |
| 2002/0090816 A1 | | 7/2002 | Ashby et al. |

FOREIGN PATENT DOCUMENTS

| | | | |
|---|---|---|---|
| JP | 2001-122698 | * | 8/2001 |

OTHER PUBLICATIONS

Kado et al., "Heteroepitaxial growth of SrO films on Si substrates," J. Appl. Phys., vol. 61, No. 6, pp. 2398-2400, Mar. 1987.

Nakagawara et al., "Effects of buffer layers in epitaxial growth of $SrTiO_3$ thin films on Si(100)," J. Appl. Phys., vol. 78, No. 12, pp. 7226-7230, Dec. 1995.

Mori et al., "Epitaxial Growth of $SrTiO_3$ Films on Si(100) Substrates Using a Focused Electron Beam Evaporation Method," Japanese Journal of Applied Physics, vol. 30, No. 8A, pp. L1415-L1417, Aug. 1991.

Tambo et al., "Molecular Beam Epitaxy of $SrTiO_3$ Films on Si(100)-2×1 with SrO Buffer Layer," Japanese Journal of Applied Physics, vol. 37, Part I, No. 8, pp. 4454-4459, Aug. 1998.

Matthee et al., "Orientation relationships of epitaxial oxide buffer layers on silicon (100) for high-temperature superconducting $Yba_2Cu_3O_{7-x}$ films," Appl. Phys. Lett., vol. 61 (10), Sep. 7, 1992, pp. 1240-1242.

Haakenaasen et al., "High quality crystalline $Yba_2Cu_3O_{7-\delta}$ films on thin silicon substrates," Appl. Phys. Lett., vol. 64 (12), Mar. 21, 1994, pp. 1573-1575.

Kwo et al., "Structure and properties of epitaxial $Ba_{0.5}TiO_3/SrRuO_3/ZrO_2$ heterostructure on Si grown by off-axis sputtering," Appl. Phys. Lett., vol. 67 (10), Sep. 4, 1995, pp. 1387-1389.

* cited by examiner

SUBSTRATE FOR ELECTRONIC DEVICE, METHOD FOR MANUFACTURING SUBSTRATE FOR ELECTRONIC DEVICE, AND ELECTRONIC DEVICE

This is a Division of application Ser. No. 10/303,955 filed Nov. 26, 2002 now U.S. Pat. No. 6,822,302. The entire disclosure of the prior application is hereby incorporated by reference herein in its entirety.

BACKGROUND OF THE INVENTION

1. Field of Invention

The present invention relates to a substrate for an electronic device, a method for manufacturing this substrate for an electronic device, and an electronic device.

2. Description of the Related Art

In the related art, ferroelectric memories which are nonvolatile memories using ferroelectrics has been used.

These ferroelectric memories are classified into a capacitor type, in which a 1T/1C structure, etc., is formed using ferroelectrics as capacitors, and an MFSFET type, in which ferroelectrics are used as gate insulating films of field-effect transistors in place of $SiO_2$.

The MFSFET type ferroelectric memory has advantages over the capacitor type, for example, it increases the packing density and non-destructive read-out. However, the MFSFET type is difficult to manufacture with respect to the structure. Thus, under present circumstances, development and commercialization of the capacitor type ferroelectric memory have been more advantageous.

Ferroelectric materials adopted in the capacitor type ferroelectric memories are divided into two materials, $Pb(Zr_{1-x}Ti_x)O_3$ (PZT) and $SrBi_2Ta_2O_9$ (SBT). Among them, the PZT materials having compositions in the neighborhood of the rhombohedron-tetragonal phase boundary (MPB) are superior in the residual dielectric polarization and coercive electric field property, and are the materials which are more advantageous than the others in commercialization.

In the related art, Pt has been used as a PZT-based ferroelectric material for a lower electrode. Since Pt has a face-centered cubic lattice structure that is a close-packed structure, it has a strong self-orientation property, and therefore brings about cubic crystal orientation even on amorphous, such as $SiO_2$.

However, since the orientation property is strong, there have been problems in that when a columnar crystal of Pt has grown, Pb, for example, is likely to diffuse in a substrate along grain boundaries, adhesion between Pt and $SiO_2$ is degraded, and the like.

Although Ti may be used to enhance this adhesion between Pt and $SiO_2$, and furthermore, TiN, etc., may be used as diffusion barrier layers against Pb, etc., electrode structures become complicated, and in addition, oxidation of Ti, diffusion of Ti into Pt, and reduction in crystallinity of PZT accompanying that are brought about, and therefore degradation of the polarization electric field (P-E) hysteresis characteristic, the leakage current characteristic, and the fatigue characteristic occur.

In order to address or avoid problems of Pt electrodes as described above, $RuO_x$, $IrO_2$, and other conductive oxide electrode materials have been researched. Among them, in particular, $SrRuO_3$ having a perovskite structure has the same crystal structure as that of PZT, and therefore has superior joining property at the interface, is likely to realize epitaxial growth of PZT, and has superior characteristics as a diffusion barrier layer against Pb.

Consequently, the related art has researched ferroelectric capacitors using $SrRuO_3$ as an electrode.

SUMMARY OF THE INVENTION

However, when the ferroelectric capacitor is configured using a metal oxide, for example, $SrRuO_3$, having a perovskite structure as a lower electrode and using PZT as a ferroelectric, there have been problems as described below.

Regarding PZT, the composition of, for example, Zr:Ti=0.3:0.7, which is on the excess Ti side compared with Zr:Ti=0.48:0.52 of MPB, is important from the viewpoint of an increase in residual dielectric polarization $P_r$ and a decrease in coercive electric field $E_c$. In this composition range, PZT exhibits a tetragonal crystal, and the polarization direction thereof is parallel to the c axis.

Consequently, regarding the ferroelectric capacitor having a structure of upper electrode/ferroelectric layer/lower electrode/substrate, in order to produce a (001) orientation film of the ferroelectric layer PZT, it is necessary to make a $SrRuO_3$ electrode as a lower electrode itself bring about pseudo-cubic crystal (100) orientation.

However, when the $SrRuO_3$ electrode, which is a perovskite type metal oxide, is deposited directly on Si (substrate), since a $SiO_2$ layer is formed at the interface, it is difficult to epitaxially grow $SrRuO_3$.

Accordingly, it is necessary to epitaxially grow some buffer layer on Si (substrate), and to epitaxially grow a $SrRuO_3$ electrode thereon.

Herein, examples of buffer layers which grow epitaxially on Si (substrate) with ease include metal oxides having a fluorite structure, for example, yttria-stabilized zirconia $Zr_{1-x}Y_xO_{2-0.5x}$ (YSZ), $CeO_2$, and $Y_2O_3$.

For example, it has been reported that a double buffer layers of $Y_2O_3$/YSZ (Appl. Phys. Lett., vol. 61 (1992) 1240) or $CeO_2$/YSZ (Appl. Phys. Lett., vol. 64 (1994) 1573) is suitable as the buffer layer to grow epitaxially $YBa_2Cu_3O_x$ having a structure similar to the perovskite. In this case, $YBa_2Cu_3O_x$ brings about (001) orientation with ease.

However, (Appl. Phys. Lett., 67 (1995) 1387) discloses that $SrRuO_3$ (in an orthorhombic crystal, a=0.5567 nm, b=0.5530 nm, and c=0.7845 nm, and in pseudo-cubic crystal, a=0.3923 nm and $2^{1/2}$a=0.5548 nm) having a simple perovskite structure does not grow epitaxially with (100) orientation on a (100) plane of YSZ (a=0.514 nm) or $CeO_2$ (a=0.541 nm), which has a fluorite structure, but brings about (110) orientation (pseudo-cubic crystal).

Accordingly, the inventor of the present invention researched materials for buffer layers which had a structure other than the fluorite structure and which grew epitaxially on Si (substrate) with ease. As a result, it was discovered that metal oxides having a NaCl structure were suitable, and therefore the present invention was made.

The present invention provides a substrate for an electronic device including a conductive oxide layer which is formed by epitaxial growth with cubic crystal (100) orientation or pseudo-cubic crystal (100) orientation and which contains a metal oxide having a perovskite structure, a method for manufacturing such a substrate for an electronic device, and an electronic device provided with such a substrate for an electronic device.

The above can be addressed or achieved by the present invention as described in the following (1) to (17).

(1) A substrate for an electronic device includes:
a Si substrate;
a buffer layer which is formed by epitaxial growth on the Si substrate and which contains a metal oxide having a NaCl structure; and
a conductive oxide layer which is formed by epitaxial growth with cubic crystal (100) orientation or pseudo-cubic crystal (100) orientation on the buffer layer and which contains a metal oxide having a perovskite structure.

(2) The substrate for an electronic device according to the aforementioned (1), where the Si substrate is a (100) substrate or a (110) substrate from which a natural oxidation film is not removed.

(3) The substrate for an electronic device according to the aforementioned (1) or (2), where the metal oxide having a NaCl structure is at least one of MgO, CaO, SrO, BaO, and solid solutions containing them.

(4) The substrate for an electronic device according to the aforementioned (1) or (2), where the aforementioned buffer layer has been grown epitaxially with cubic crystal (110) orientation.

(5) The substrate for an electronic device according to any one of the aforementioned (1) to (4), where the buffer layer has an average thickness of 10 nm or less.

(6) The substrate for an electronic device according to any one of the aforementioned (1) to (5), where the metal oxide having a perovskite structure is at least one of $CaRuO_3$, $SrRuO_3$, $BaRuO_3$, and solid solutions containing them.

(7) A method for manufacturing a substrate for an electronic device, including:
cleaning a Si substrate;
forming a buffer layer containing a metal oxide having a NaCl structure by epitaxial growth, in which after the Si substrate is cleaned, the Si substrate in a vacuum apparatus is irradiated with plasma containing oxygen plasma and metal element plasma; and
forming a conductive oxide layer containing a metal oxide having a perovskite structure by epitaxial growth with cubic crystal (100) orientation or pseudo-cubic crystal (100) orientation, in which after the buffer layer is formed, the buffer layer in a vacuum apparatus is irradiated with plasma containing oxygen plasma and metal element plasma.

(8) The method for manufacturing a substrate for an electronic device according to the aforementioned (7), where in the cleaning the Si substrate, a treatment to produce a reconstructed surface or a hydrogen-terminated surface is not performed.

(9) The method for manufacturing a substrate for an electronic device according to aforementioned (8), where in the forming the buffer layer, the buffer layer is grown epitaxially while a natural oxidation film on the Si substrate surface is removed by irradiating the Si substrate selectively with the metal element plasma rather than the oxygen plasma.

(10) The method for manufacturing a substrate for an electronic device according to any one of the aforementioned (7) to (9), where the metal oxide having a NaCl structure is at least one of MgO, CaO, SrO, BaO, and solid solutions containing them.

(11) The method for manufacturing a substrate for an electronic device according to any one of the aforementioned (7) to (10), where the buffer layer is grown epitaxially with cubic crystal (110) orientation.

(12) The method for manufacturing a substrate for an electronic device according to any one of the aforementioned (7) to (11), where the buffer layer has an average thickness of 10 nm or less.

(13) The method for manufacturing a substrate for an electronic device according to any one of the aforementioned (7) to (12), where the metal oxide having a perovskite structure is at least one of $CaRuO_3$, $SrRuO_3$, $BaRuO_3$, and solid solutions containing them.

(14) The method for manufacturing a substrate for an electronic device according to any one of the aforementioned (7) to (13), where the plasma is generated using laser light.

(15) An electronic device provided with the substrate for an electronic device according to any one of the aforementioned (1) to (6).

(16) The electronic device according to the aforementioned (15), which is a capacitor.

(17) The electronic device according to the aforementioned (15), which is a cantilever.

DETAILED DESCRIPTION OF PREFERRED EMBODIMENTS

The preferred embodiments of a substrate for an electronic device, a method for manufacturing a substrate for an electronic device, and an electronic device of the present invention are described below.

<Substrate for Electronic Device>

First, the substrate for an electronic device of the present invention is described below.

Figure 1:
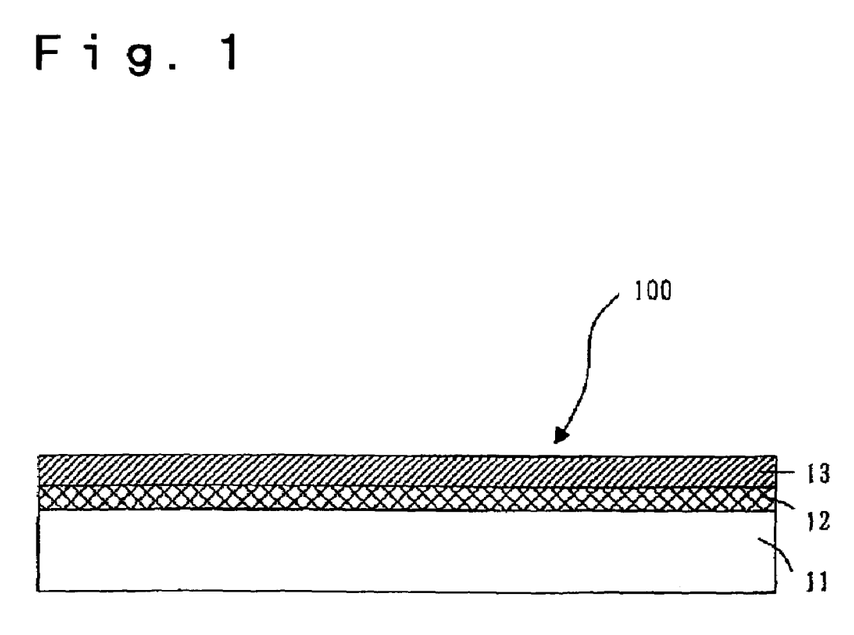
FIG. 1 is a sectional view showing an embodiment of the substrate for an electronic device of the present invention.

FIG. 1 is a sectional view showing an embodiment of the substrate for an electronic device of the present invention, and FIGS. 2(a)-2(c) are schematics illustrating the method for manufacturing a substrate for an electronic device of the present invention.

A substrate 100 for an electronic device shown in FIG. 1 includes a Si substrate 11, a buffer layer 12 formed on the Si substrate 11, and a conductive oxide layer 13 formed on the buffer layer 12.

The Si substrate 11 supports the buffer layer 12 and the conductive oxide layer 13 described below, and is formed of a member in the shape of a flat plate.

As the Si substrate 11, either a Si substrate in which a natural oxidation film is not removed from the surface thereof or a Si substrate in which a natural oxidation film is removed, may be used. However, it is preferable to use the one in which a natural oxidation film is not removed. This allows operations to remove the natural oxidation film (for example, RCA cleaning, hydrofluoric acid cleaning, etc.) to be omitted, and therefore there are advantages in reduction of the manufacturing time and reduction of the manufacturing cost of the substrate 100 for the electronic device.

As the Si substrate 11, for example, a (100) substrate, a (110) substrate, and a (111) substrate can be used. Among them, it is preferable to use the (100) substrate or the (110) substrate. Since the (100) substrate or the (110) substrate of Si is a general-purpose oriented substrate, the manufacturing cost of the substrate 100 for an electronic device can be reduced by using such a Si substrate 11.

The average thickness of the Si substrate 11 is not specifically limited. However, for example, it is preferably 10 μm to 1 mm, and more preferably, is 100 to 600 μm. When the average thickness of the Si substrate is specified to be within the aforementioned range, there is an advantage in that the substrate 100 for an electronic device can be made low-profile (be miniaturized) while adequate strength is ensured.

The buffer layer 12 made of a thin film is installed (formed) on the Si substrate 11.

This buffer layer 12 is formed on the Si substrate 11 by epitaxial growth, and contains a metal oxide having a NaCl structure.

According to such a buffer layer 12, the conductive oxide layer 13 described below can be formed thereon with ease and reliability. That is, the conductive oxide layer 13 containing a metal oxide having a perovskite structure can be formed on such a buffer layer 12 by epitaxial growth with cubic crystal (100) orientation or pseudo-cubic crystal (100) orientation with ease and reliability.

When the buffer layer 12 is installed, an excellent joining property (adhesion) between the Si substrate 11 and the conductive oxide layer 13 can be achieved.

Examples of metal oxides having a NaCl structure include, for example, MgO, CaO, SrO, BaO, MnO, FeO, CoO, NiO, and a solid solution containing them. Among them, especially, at least one of MgO, CaO, SrO, BaO, and solid solutions containing them is preferably used. Since the lattice mismatch between such a metal oxide having a NaCl structure and both of Si and the metal oxide having a perovskite structure is small (for example, about 5% to 7%), the joining property of the Si substrate 11 and the conductive oxide layer 13 can be further enhanced.

Furthermore, the buffer layer 12 may be any one of those epitaxially grown with, for example, cubic crystal (110) orientation, cubic crystal (100) orientation, and cubic crystal (111) orientation. Among them, especially, the one epitaxially grown with cubic crystal (110) orientation is preferable. When the buffer layer 12 is epitaxially grown with cubic crystal (110) orientation, the average thickness of the buffer layer 12 can be made relatively small. According to this, even when the buffer layer 12 is formed of a metal oxide, for example, SrO, which is deliquescent and which has a NaCl structure, it is possible to prevent or substantially prevent an inconvenience that degradation occurs by water in the air during manufacture and during use, and therefore to produce a practical substrate 100 for an electronic device.

From the aforementioned points of view, preferably, the buffer layer 12 is formed to have a thickness to be as small as possible. Specifically, the average thickness thereof is preferably about 10 nm or less, and more preferably, is about 5 nm or less. This allows the aforementioned effects to be further enhanced.

When the average thickness of the buffer layer 12 is made to be as small as described above, for example, in the case where a ferroelectric memory is manufactured, there is also an advantage in that a low-profile (for example, about 10 nm in thickness) capacitor required to realize the finer design rule of this ferroelectric memory can be manufactured.

The conductive oxide layer 13 is installed (formed) on the buffer layer 12.

This conductive oxide layer 13 is formed by epitaxial growth with cubic crystal (100) orientation or pseudo-cubic crystal (100) orientation on the buffer layer 12 and contains a metal oxide having a perovskite structure.

Examples of metal oxides having a perovskite structure include, for example, $CaRuO_3$, $SrRuO_3$, $BaRuO_3$, $SrVO_3$, $(La,Sr)MnO_3$, $(La,Sr)CrO_3$, $(La,Sr)CoO_3$, and a solid solution containing them. Among them, especially, at least one of $CaRuO_3$, $SrRuO_3$, $BaRuO_3$, and solid solutions containing them is used preferably. These metal oxides having a perovskite structure have excellent electrical conductivity and chemical stability. Consequently, the conductive oxide layer 13 containing these metal oxides having a perovskite structure can be made to have excellent electrical conductivity and chemical stability. Such a conductive oxide layer 13 is useful as an electrode when an electronic device is configured.

The average thickness of this conductive oxide layer 13 is not specifically limited. However, for example, it is preferably 10 to 300 nm, and more preferably, is 50 to 150 nm.

When various electronic devices are manufactured using the substrate 100 for an electronic device including the conductive oxide layer 13 as described above, regarding these electronic devices, various properties can be enhanced. This point is described below.

Figure 2:
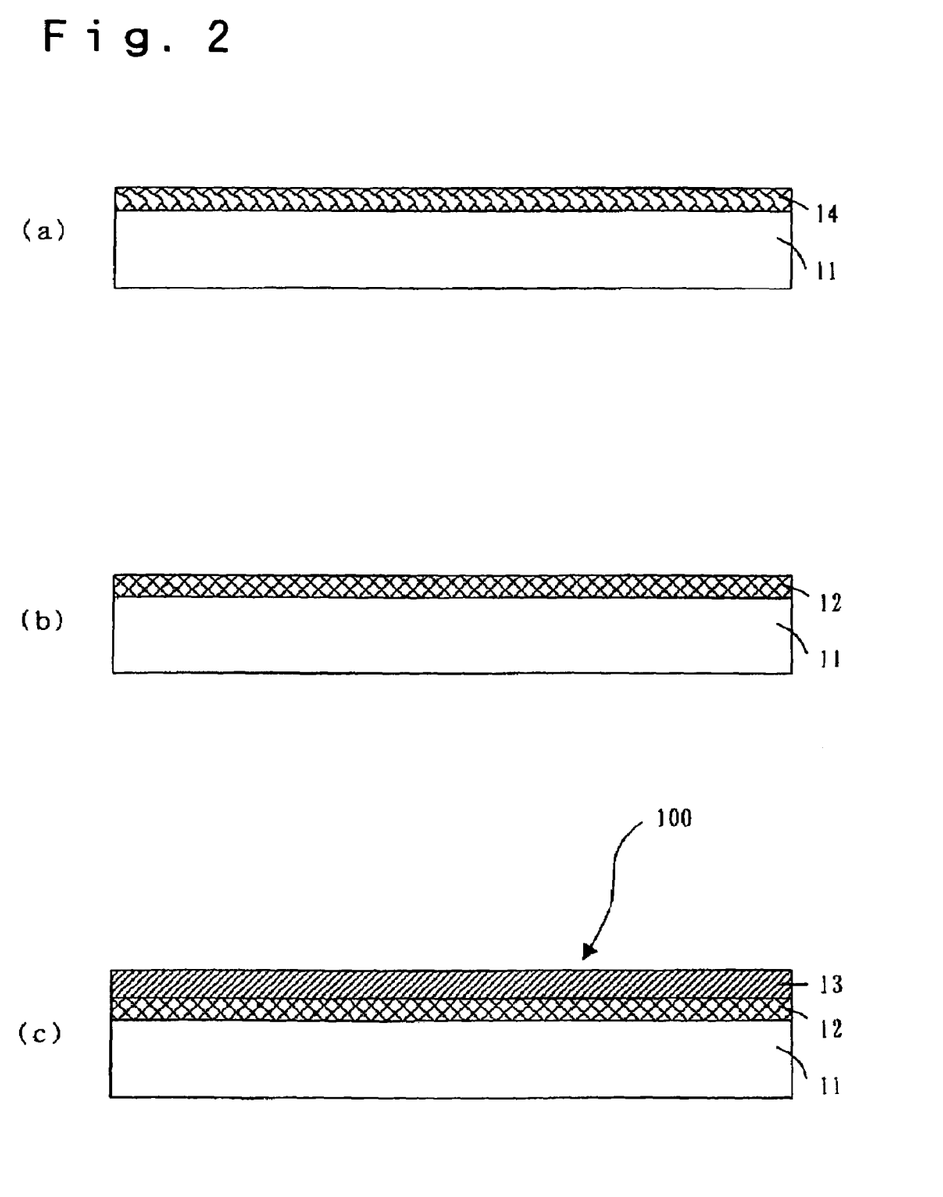
FIGS. 2(a)-2(c) are sectional views illustrating the method for manufacturing a substrate for electronic device of the present invention.

Next, a method for manufacturing the substrate 100 for an electronic device of the present invention is described with reference to FIG. 2.

The aforementioned substrate 100 for an electronic device can be manufactured, for example, as described below.

The method for manufacturing the substrate 100 for an electronic device shown below includes cleaning the Si substrate 11 (Si substrate cleaning), forming the buffer layer 12 on the Si substrate 11 (buffer layer formation), and forming the conductive oxide layer 13 on the buffer layer 12 (conductive oxide layer formation). Each of the steps are described below sequentially.

The Si substrate 11 is prepared. As this Si substrate 11, the one having a uniform thickness and having neither bending nor flaw is suitably used.

[1A] Si Substrate Cleaning

The Si substrate is cleaned. That is, materials attached to the surface of the Si substrate 11 are removed (for example, degreasing).

The removal of the materials can be performed by, for example, bringing the Si substrate 11 and a solution for removal into contact with each other.

The method of the contact between the Si substrate 11 and the solution for removal is not specifically limited.

Examples thereof include, for example, immersing the Si substrate 11 in the solution for removal (immersion), spraying (showering) the solution for removal on the surface of the Si substrate 11, and coating the surface of the Si substrate 11 with the solution for removal (coating).

Among them, it is preferable to use immersion as the aforementioned method of contact. With such immersion, the materials (for example, organic materials) can be removed from the surface of the Si substrate 11 with ease and reliability. Furthermore, according to the immersion, there is another advantage in that a plurality of (large quantities of) Si substrates 11 can be treated simultaneously.

In this case, the immersion may be performed while ultrasonic vibration is applied to the solution for removal, or be performed while at least one of the Si substrate and the solution for removal is shaken.

Examples of solutions for removal include various organic solvents: for example, alcohols, such as methyl alcohol, ethyl alcohol, propyl alcohol, and butyl alcohol; ketones, such as acetone, methyl ethyl ketone, and methyl isobutyl ketone; esters, such as ethyl acetate and methyl acetate; ethers, such as diethyl ether, diisopropyl ether, tetrahydrofuran, and dioxane; nitriles, such as acetonitrile and propionitrile; halogenated hydrocarbons such as methylene chloride, chloroform, 1,2-dichloroethane, and 1,1,2,2-tetrachloroethane; and hydrocarbons, such as n-hexane, petroleum ether, toluene, benzene, and xylene. One sort among them can be used, or at least two sorts can be used in combination.

As described above, in the present invention, a Si substrate 11 in which the natural oxidation film is not removed is used suitably as the Si substrate 11. Consequently, in the present step [1A], it is possible to omit (not to perform) the treatment for producing a reconstructed surface or the treatment for producing the hydrogen-terminated surface on the surface of the Si substrate 11. This allows the method for manufacturing the substrate 100 for electronic device to be simplified, and therefore reduction of the manufacturing time and reduction of the manufacturing cost to be achieved.

Consequently, the natural oxidation film 14 exists on the surface of the Si substrate 11 (refer to FIG. 2(a)).

[2A] Buffer Layer Formation

Subsequently, the buffer layer 12 is formed on the Si substrate 11. This can be performed, for example, as described below.

The Si substrate 11 is mounted on a substrate holder.

Under this condition, the Si substrate 11 is placed in a vacuum apparatus in which the back pressure is reduced to, for example, about $1 \times 10^{-9}$ to $1 \times 10^{-6}$ Torr at room temperature.

In the vacuum apparatus, a first target (target for buffer layer) containing the constituent elements of the buffer layer 12 is placed facing the Si substrate 11 with a predetermined distance therebetween.

Subsequently, the Si substrate 11 is heated so as to raise the temperature by using, for example, an infrared lamp (heating device).

The rate of the temperature increase is not specifically limited. For example, it is preferably specified to be on the order of 1° C. to 20° C./min, and more preferably specified to be on the order of 5° C. to 15° C./min.

The temperature (ultimate temperature) of the Si substrate is not specifically limited as well. For example, it is preferably specified to be about 500° C. to 900° C., and more preferably specified to be about 600° C. to 800° C.

At this time, since a part of the natural oxidation film 14 is vaporized as SiO in accordance with the increase in temperature of the Si substrate 11, the pressure in the vacuum apparatus is increased on a temporary basis. Thereafter, at the time when the Si substrate has reached the predetermined temperature, the pressure in the vacuum apparatus is a constant value.

Each of the conditions, for example, the rate of the temperature increase, the temperature of the Si substrate 11, and the pressure in the vacuum apparatus, is not limited to the aforementioned range, as long as a new thermal oxidation film is not formed on the surface of the Si substrate 11.

After the pressure in the vacuum apparatus becomes constant (for example, about $1 \times 10^{-8}$ to $1 \times 10^{-6}$ Torr), the Si substrate 11 is irradiated with plasma containing oxygen plasma and metal element plasma. This allows the buffer layer 12 containing a metal oxide having a NaCl structure (as is described above) to epitaxially grow on the substrate 11 with, for example, cubic crystal (110) orientation, and to be formed (deposited) in the shape of a film (thin film).

This plasma can be generated by making, for example, laser light, argon gas (inert gas) plasma, and an electron beam be irradiated (incident) on the surface of the aforementioned first target.

Among them, preferably, the plasma is generated especially with the laser light. A method using this laser light allows plasma to be generated with ease and reliability by using a vacuum apparatus provided with an incident window for the laser light and having a simple structure, and therefore the buffer layer 12 to be formed.

Specifically, when the buffer layer 12 is formed from SrO as a primary material, the first target formed of $SrO_2$ is used suitably. When the first target is irradiated with the laser light, a plasma plume of Sr and O is generated on the first target surface. Such a plasma plume comes into contact with the surface (top surface) of the Si substrate 11, and then the buffer layer 12 is formed.

Preferably, the laser light is specified to be pulsed light preferably having a wavelength about 150 to 300 nm and a pulse length about 1 to 100 ns. Specific examples of such laser light include, for example, excimer lasers, such as an ArF excimer laser, a KrF excimer laser, and a XeCl excimer laser, a YAG laser, a $YVO_4$ laser, and a $CO_2$ laser. Among them, the ArF excimer laser or the KrF excimer laser is preferable. The ArF excimer laser and the KrF excimer laser can be handled with ease, and can generate plasma with ease and reliability.

Regarding such plasma (plasma plume), it is preferable to irradiate the Si substrate 11 selectively with the metal element plasma rather than the oxygen plasma. This allows the metal element plasma, which is more likely to thermodynamically bond to oxygen rather than to Si, to substitute for Si in the natural oxidation film 14, and therefore the metal oxide having a NaCl structure to be produced more easily. That is, the buffer layer 12 can be epitaxially grown while the natural oxidation film 14 on the Si substrate 11 surface is removed.

From such points of view, each of the conditions in formation of the buffer layer 12 can be specified, for example, as described below.

The frequency of the laser light is preferably specified to be on about 3 Hz or less, and more preferably, is specified to be about 1.5 Hz or less.

The energy density of the laser light is preferably specified to be about 0.5 $J/cm^2$ or more, and more preferably, is specified to be about 2 $J/cm^2$ or more.

The temperature of the Si substrate 11 is preferably specified to be about 550° C. to 850° C., and more preferably is specified to be about 650° C. to 750° C.

The distance between the Si substrate 11 and the first target is preferably specified to be about 50 mm or less, and more preferably is specified to be about 35 mm or less.

The pressure in the vacuum apparatus is preferably specified to be about $1 \times 10^{-4}$ Torr or less, and more preferably is specified to be about $1 \times 10^{-6}$ Torr or less.

When each of the conditions in formation of the buffer layer 12 is specified to be within the aforementioned range, the Si substrate can be irradiated selectively with the metal element plasma rather than the oxygen plasma. Consequently, the buffer layer 12 can be formed more reliably while the natural oxidation film 14 is removed.

At this time, when the duration of irradiating the laser light (duration of irradiating the plasma onto the Si substrate 11) is appropriately set, the average thickness of the buffer layer 12 can be adjusted within the aforementioned range. Although this duration of irradiating the laser light varies among the aforementioned conditions, in general, it is preferably specified to be about 200 seconds or less, and more preferably is specified to be about 100 seconds or less.

As described above, the buffer layer 12 is produced (refer to FIG. 2(b)).

[3A] Conductive Oxide Layer Formation

Subsequently, the conductive oxide layer 13 is formed on the buffer layer 12. This can be performed, for example, as described below.

In advance of formation of the conductive oxide layer 13, a second target (target for conductive oxide layer) containing the aforementioned constituent elements of the conductive oxide layer 13 is placed facing the buffer layer 12 (the Si substrate 11) with a predetermined distance therebetween in place of the first target.

Following the aforementioned [2A], the buffer layer 12 is irradiated with the plasma containing oxygen plasma and metal element plasma. This allows the conductive oxide layer 13 containing a metal oxide having a perovskite structure (as is described above) to epitaxially grow on the buffer layer 12 with, for example, cubic crystal (100) orientation, and to be formed (deposited) in the shape of a film (thin film or thick film).

This plasma is preferably generated by making laser light to be irradiated (incident) onto the surface of the second target in a manner similar to that in [2A].

Specifically, when the conductive oxide layer 13 is formed from $SrRuO_3$ as a primary material, the second target composed of $SrRuO_3$ is used suitably. When the second target is irradiated with the laser light, a plasma plume of Sr, Ru, and O is generated on the second target surface. Such a plasma plume comes into contact with the surface (top surface) of the buffer layer 12, and therefore the conductive oxide layer 13 is formed.

The ArF excimer laser or the KrF excimer laser preferably provides such laser light in a manner similar to that in [2A].

Each of the conditions in formation of the conductive oxide layer 13 is to be satisfied as long as various metal element plasmas (plasma plume) reach the buffer layer 12 at predetermined ratios (that is, the compositional ratio in the metal oxide having a perovskite structure), and the conductive oxide layer 13 can be epitaxially grown. Therefore, each of the conditions can be specified, for example, as described below.

The frequency of the laser light is preferably specified to be about 30 Hz or less, and more preferably is specified to be about 15 Hz or less.

The energy density of the laser light is preferably specified to be about 0.5 J/cm² or more, and more preferably is specified to be about 2 J/cm² or more.

The temperature of the Si substrate 11, on which the buffer layer 12 has been formed, is preferably specified to be on the order of 400° C. to 700° C., and more preferably is specified to be on the order of 500° C. to 600° C.

The distance between the Si substrate 11, on which-the buffer layer 12 has been formed, and the second target is preferably specified to be about 60 mm or less, and more preferably is specified to be about 45 mm or less.

The partial pressure of oxygen in the vacuum apparatus is preferably specified to be, for example, about $1 \times 10^{-3}$ Torr or more under supply of an oxygen gas, and is preferably specified to be, for example, about $1 \times 10^{-5}$ Torr or more under supply of atomic oxygen radicals.

At this time, when the duration of irradiating the laser light (duration of irradiating the plasma onto the buffer layer 12) is appropriately set, the average thickness of the conductive oxide layer 13 can be adjusted within the aforementioned range. Although this duration of irradiating the laser light varies among the aforementioned conditions, in general, it is preferably specified to be about 3 to 90 minutes, and more preferably is specified to be about 15 to 45 minutes.

When each of the conditions is appropriately set, if necessary, a $SiO_2$ layer (thermal oxidation film) can also be formed on a part of the Si substrate 11 (for example, in the neighborhood of the boundary to the buffer layer 12).

As described above, the conductive oxide layer 13 is produced (refer to FIG. 2(c)).

The substrate 100 for electronic device is manufactured through [1A] to [3A].

<Electronic Device (Capacitor)>

Next, the electronic device of the present invention is described below.

Figure 3:
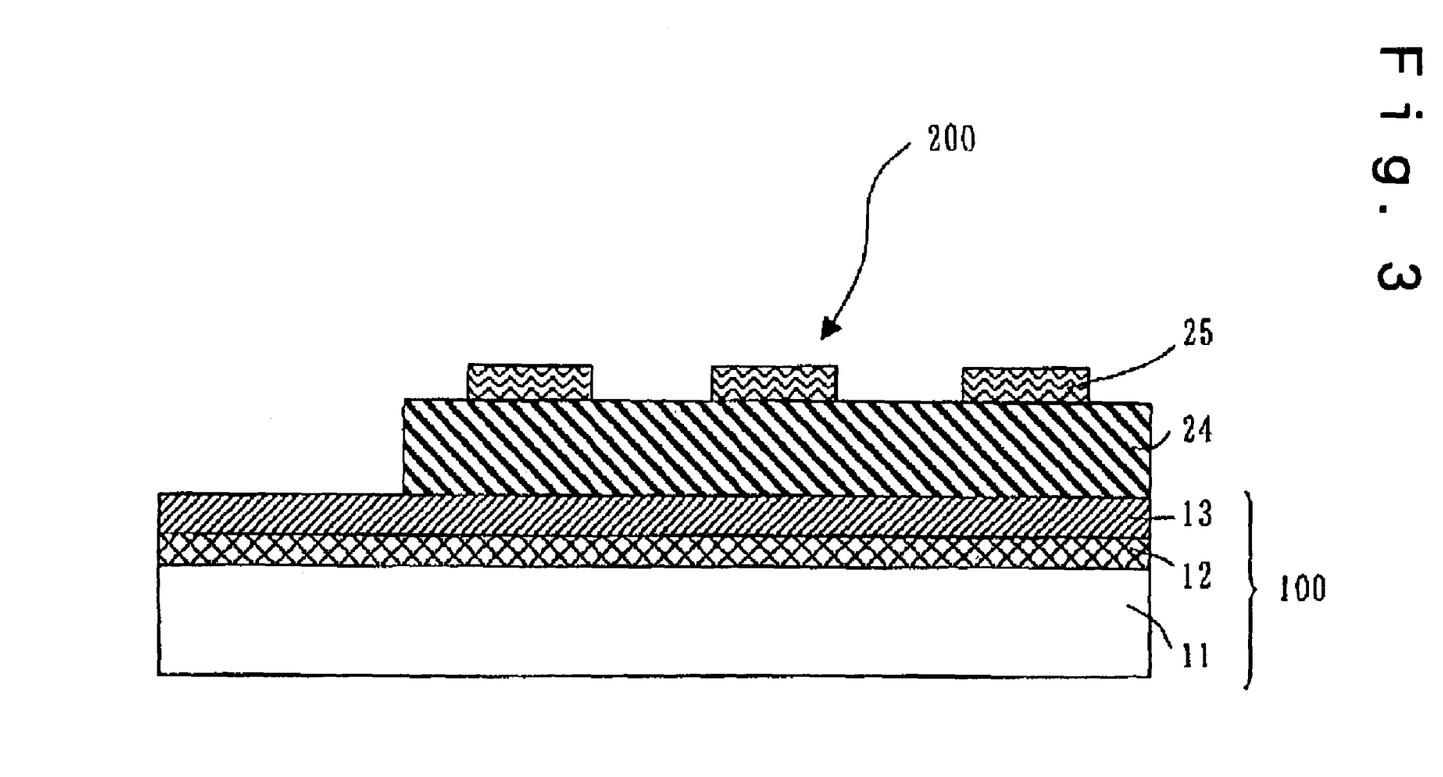
FIG. 3 is a sectional view showing an embodiment in which the electronic device of the present invention is applied to a capacitor.

FIG. 3 is a sectional view showing an embodiment in which the electronic device of the present invention is applied to a capacitor.

Regarding a capacitor 200 shown in FIG. 3, the following explanations are made with emphasis on the differences from the aforementioned substrate 100 for an electronic device, and regarding similar items, the explanations thereof are omitted.

The capacitor 200 includes the substrate 100 for an electronic device, a ferroelectric layer 24 installed in a predetermined region on the substrate 100 for an electronic device, and an upper electrode layer 25 installed on the ferroelectric layer 24.

In the capacitor 200, the conductive oxide layer 13 of the substrate 100 for an electronic device functions as one electrode. Hereafter, the conductive oxide layer 13 is referred to as "lower electrode layer 13".

The ferroelectric layer 24 is installed (formed) on this lower electrode layer 13 (substrate 100 for an electronic device).

The ferroelectric layer 24 can be formed of various ferroelectric materials, and especially, the one containing a ferroelectric material having a perovskite structure is preferable. This enables, in the capacitor 200, various properties to be enhanced, for example, the residual dielectric polarization is increased and the coercive electric field is reduced. Consequently, when a ferroelectric memory is manufactured using such a capacitor 200, the resulting ferroelectric memory can be made to have excellent rectangularity of the hysteresis curve.

The ferroelectric layer 24 may be any one of those epitaxially grown with, for example, tetragonal crystal (001) orientation and rhombohedral crystal (100) orientation.

Especially, the one epitaxially grown with tetragonal crystal (001) orientation is preferable. This enables the effects to further be enhanced.

As described above, the lower electrode layer 13 contains a metal oxide having a perovskite structure. Furthermore, the lattice mismatch between the metal oxide having a perovskite structure and the ferroelectric material having a perovskite structure is small. Consequently, the ferroelectric layer 24 can be epitaxially grown with tetragonal crystal (001) orientation on the lower electrode layer 13 with ease and reliability.

Examples of such ferroelectric materials having a perovskite structure include, for example, $Pb(Zr_{1-x}Ti_x)O_3$ (PZT), $BaTiO_3$, $PbZnO_3$, $PbNbO_3$, $PbFeO_3$, $PbWO_3$, and solid solutions containing them. Among them, especially, at least one of PZT, $BaTiO_3$, and solid solutions containing them is preferable.

The average thickness of the ferroelectric layer 24 is not specifically limited. However, for example, it is preferably about 50 to 300 nm, and more preferably, is about 100 to 200 nm. In the capacitor 200, when the average thickness of the ferroelectric layer 24 is specified to be within the aforementioned range, various properties are further enhanced.

The upper electrode layer 25 in the shape of the teeth of a comb (or the shape of a belt) is installed (formed) on the ferroelectric layer 24.

As the constituent material of this upper electrode layer 25, for example, one sort of Pt, Ir, Au, Ag, Ru, alloys containing them, and the like can be used, or two sorts or more of them can be used in combination.

The average thickness of the upper electrode layer 25 is not specifically limited. However, for example, it is preferably about 10 to 300 nm, and more preferably, is about 50 to 150 nm.

A method for manufacturing the capacitor 200 is described below.

The aforementioned capacitor 200 can be manufactured, for example, as described below.

The method for manufacturing the capacitor 200 shown below includes cleaning the Si substrate 11 (Si substrate cleaning), forming the buffer layer 12 on the Si substrate 11 (buffer layer formation), and forming the lower electrode layer (conductive oxide layer) 13 on the buffer layer 12 (lower electrode layer formation), forming the ferroelectric layer 24 on the lower electrode layer 13 (ferroelectric layer formation), taking out the lower electrode layer 13 (lower electrode layer taking-out), and forming the upper electrode layer 25 on the ferroelectric layer 24 (upper electrode layer formation). Each of these are described below sequentially.

[1B] Si Substrate Cleaning

This is performed in a manner similar to that in [1A].

The temperature of the lower electrode layer 13 (substrate 100 for an electronic device) is preferably specified to be about 450° C. to 750° C., and more preferably is specified to be about 550° C. to 650° C.

The distance between the substrate 100 for an electronic device and the third target is preferably specified to be about 60 mm or less, and more preferably is specified to be about 45 mm or less.

The partial pressure of oxygen in the vacuum apparatus is preferably specified to be, for example, about $1\times10^{-3}$ Torr or more under supply of an oxygen gas, and is preferably specified to be, for example, about $1\times10^{-5}$ Torr or more under supply of atomic oxygen radicals.

At this time, when the duration of irradiating the laser light (duration of irradiating the lower electrode layer 13 with the plasma) is appropriately set, the average thickness of the ferroelectric layer 24 can be adjusted within the aforementioned range. Although this duration of irradiating the laser light varies among the conditions, in general, it is preferably specified to be about 10 to 60 minutes, and more preferably, is specified to be about 20 to 40 minutes.

When each of the conditions is appropriately set, if necessary, a $SiO_2$ layer (thermal-oxidation film) can also be formed on a part of the Si substrate 11 (for example, in the neighborhood of the boundary to the buffer layer 12).

As described above, the ferroelectric layer 24 is produced.

[5B] Lower Electrode Layer Taking-Out

A part of the ferroelectric layer 24 is removed, and the lower electrode layer 13 is taken out (exposed). Accordingly, the ferroelectric layer 24 is installed in a predetermined region on the lower electrode layer 13. This can be performed by, for example, using a photolithography method.

A resist layer is formed on the ferroelectric layer 24 except the part to be removed.

An etching treatment (for example, a wet etching treatment and a dry etching treatment) is applied to the ferroelectric layer 24.

The resist layer is then removed. This allows a part (left side in FIG. 3) of the lower electrode layer to be exposed.

[6B] Upper Electrode Layer Formation

The upper electrode layer 25 is formed on the ferroelectric layer 24. This can be performed, for example, as described below.

[2B] Buffer Layer Formation

This is performed in a manner similar to that in [2A].

[3B] Lower Electrode Layer Formation

This is performed in a manner similar to that in [3A].

[4B] Ferroelectric Layer Formation

The ferroelectric layer 24 is formed on the lower electrode layer 13. This can be performed, for example, as described below.

In advance of formation of the ferroelectric layer 24, a third target (target for ferroelectric layer) containing the aforementioned constituent elements of the ferroelectric layer 24 is placed facing the substrate 100 for an electronic device with a predetermined distance therebetween in place of the second target.

Following [3B], the lower electrode layer 13 is irradiated with plasma containing oxygen plasma and metal element plasma. This allows the ferroelectric layer 24 containing a ferroelectric material having a perovskite structure (as is described above) to epitaxially be grown on the lower electrode layer 13 with, for example, tetragonal crystal (001) orientation, and to be formed (deposited) in the shape of a film (thin film or thick film).

This plasma is preferably generated by making laser light be irradiated (incident) onto the surface of the third target in a manner similar to that in [2A].

Specifically, when the ferroelectric layer 24 is formed from $Pb(Zr_{0.3}Ti_{0.7})O_3$ as a primary material, the third target formed of $Pb(Zr_{0.3}TiO_{0.7})O_3$ is used suitably. When the third target is irradiated with the laser light, a plasma plume of Pb, Zr, Ti, and O is generated on the third target surface. Such a plasma plume comes into contact with the surface (top surface) of the lower electrode layer 13, and therefore the ferroelectric layer 24 is formed.

The ArF excimer laser or the KrF excimer laser is preferable as such laser light similarly to [2A].

Each of the conditions in formation of the ferroelectric layer 24 is to be satisfied as long as various metal element plasmas (plasma plume) reach the lower electrode layer 13 at predetermined ratios (that is, the compositional ratio in the ferroelectric material having a perovskite structure), and the ferroelectric layer 24 can be epitaxially grown, and therefore each of the conditions can be specified, for example, as described below.

The frequency of the laser light is preferably specified to be about 30 Hz or less, and more preferably is specified to be about 15 Hz or less.

The energy density of the laser light is preferably specified to be about 0.5 J/cm$^2$ or more, and more preferably is specified to be about 1.5 J/cm$^2$ or more.

A mask layer having a desired pattern shape is formed on the ferroelectric layer 24 by, for example, a sputtering method.

A material for the upper electrode layer 25 formed of, for example, Pt, is then formed in the shape of a film (thin film or thick film) by using, for example, evaporation, sputtering and printing.

The mask layer is then removed.

As described above, the upper electrode layer 25 is produced.

The capacitor 200 is manufactured through [1B] to [6B].

<Electronic Device (Cantilever)>

Figure 4:
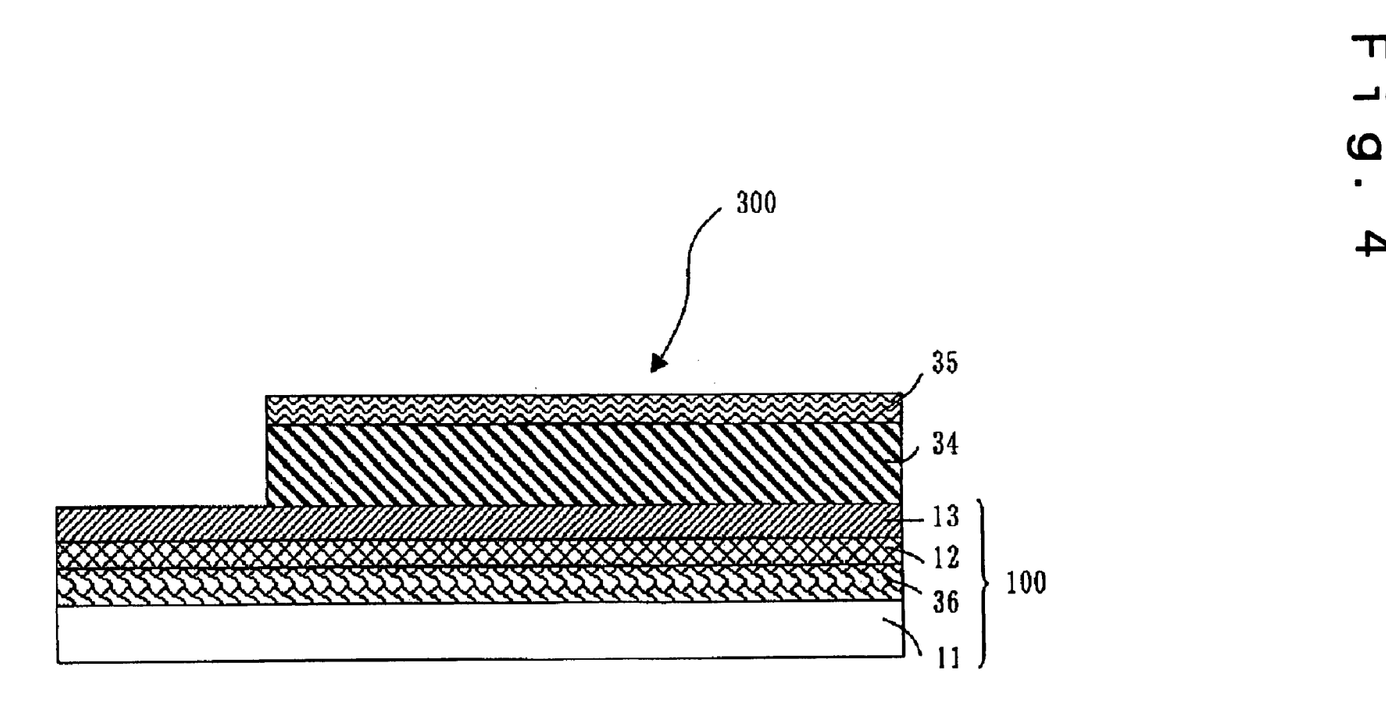
FIG. 4 is a sectional view showing an embodiment in which the electronic device of the present invention is applied to a cantilever.

FIG. 4 is a sectional view showing an embodiment in which the electronic device of the present invention is applied to a cantilever.

Regarding a cantilever 300 shown in FIG. 4, the following explanations are made with emphasis on the differences from the aforementioned substrate 100 for an electronic device and the capacitor 200, and regarding similar items, the explanations thereof are omitted.

The cantilever 300 includes the substrate 100 for an electronic device, a piezoelectric layer 34 installed in a predetermined region on the substrate 100 for an electronic device, and an upper electrode layer 35 installed on the piezoelectric layer 34.

In this substrate 100 for an electronic device, a SiO$_2$ layer (thermal oxidation film) 36 is formed on the Si substrate 11 in the neighborhood of the boundary to the buffer layer 12. This SiO$_2$ layer 36 functions as an elastic substrate of a monomorph type cantilever together with the Si substrate 11.

The piezoelectric layer 34 is installed (formed) on the lower electrode layer 13 (substrate 100 for an electronic device).

The piezoelectric layer 34 can be formed of various ferroelectric materials, and especially, the one containing a ferroelectric material having a perovskite structure is preferable. This enables, in the cantilever 300, various properties, for example, an electric field strain property, to be enhanced.

The piezoelectric layer 34 may be any one of those epitaxially grown with, for example, rhombohedral crystal (100) orientation and tetragonal crystal (001) orientation. Especially, the one epitaxially grown with rhombohedral crystal (100) orientation is preferable. This allows the effects to be further enhanced.

As described above, the lower electrode layer 13 contains a metal oxide having a perovskite structure. Furthermore, the lattice mismatch between the metal oxide having a perovskite structure and the ferroelectric material having a perovskite structure is small. Consequently, the piezoelectric layer 34 can be epitaxially grown with rhombohedral crystal (100) orientation on the lower electrode layer 13 with ease and reliability.

As this ferroelectric material having a perovskite structure, materials similar to those mentioned in the capacitor 200 can be used.

The average thickness of the piezoelectric layer 34 is not specifically limited. However, for example, it is preferably about 100 to 3,000 nm, and more preferably, is about 500 to 2,000 nm. In the cantilever 300, when the average thickness of the piezoelectric layer 34 is specified to be within the aforementioned range, various properties are further enhanced.

The upper electrode layer 35 is installed (formed) on the piezoelectric layer 34.

The constituent material and the average thickness of this upper electrode layer 35 can be similar to those of the upper electrode layer 25 described in the capacitor 200.

A method for manufacturing the cantilever 300 is described below.

The cantilever 300 can be manufactured, for example, as described below.

The method for manufacturing the cantilever 300 shown below includes cleaning the Si substrate 11 (Si substrate cleaning), forming the buffer layer 12 on the Si substrate 11 (buffer layer formation), and forming the lower electrode layer (conductive oxide layer) 13 on the buffer layer 12 (lower electrode layer formation), forming the piezoelectric layer 34 on the lower electrode layer 13 (piezoelectric layer formation), taking out the lower electrode layer 13 (lower electrode layer taking-out), and forming the upper electrode layer 35 on the piezoelectric layer 34 (upper electrode layer formation). Each of the steps are described below sequentially.

[1C] Si Substrate Cleaning

This is performed in a manner similar to that in the aforementioned [1A].

[2C] Buffer Layer Formation

This is performed in a manner similar to that in the [2A].

[3C] Lower Electrode Layer Formation

This is performed in a manner similar to that in [3A].

[4C] Piezoelectric Layer Formation

The piezoelectric layer 34 is formed on the lower electrode layer 13. This can be performed in a manner similar to that in [4B].

In advance of formation of the piezoelectric layer 34, a third target (target for piezoelectric layer) containing the aforementioned constituent elements of the piezoelectric layer 34 is placed facing the substrate 100 for an electronic device with a predetermined distance therebetween in place of the second target.

Following [3C], the lower electrode layer 13 is irradiated with plasma containing oxygen plasma and metal element plasma. This allows the piezoelectric layer 34 containing a ferroelectric material having a perovskite structure (as is described above) to be epitaxially grown on the lower electrode layer 13 with, for example, rhombohedral crystal (100) orientation, and is formed (deposited) in the shape of a film (thin film or thick film).

Each of the conditions in formation of the piezoelectric layer 34 is to be satisfied as long as various metal element plasmas (plasma plume) reach the lower electrode layer 13 at predetermined ratios (that is, the compositional ratio in the ferroelectric material having a perovskite structure), and the piezoelectric layer 34 can be epitaxially grown and, therefore, each of the conditions can be specified, for example, as described below.

The frequency of the laser light is preferably specified to be about 30 Hz or less, and more preferably is specified to be about 15 Hz or less.

The energy density of the laser light is preferably specified to be about 0.5 J/cm$^2$ or more, and more preferably is specified to be about 2 J/cm$^2$ or more.

The temperature of the lower electrode layer 13 (substrate 100 for an electronic device) is preferably specified to be about 450° C. to 750° C., and more preferably is specified to be about 550° C. to 650° C.

The distance between the substrate 100 for electronic device and the third target is preferably specified to be about 60 mm or less, and more preferably is specified to about 45 mm or less.

The partial pressure of oxygen in the vacuum apparatus is preferably specified to be, for example, about $1\times10^{-3}$ Torr or more under supply of an oxygen gas, and is preferably specified to be, for example, about $1\times10^{-5}$ Torr or more under supply of atomic oxygen radicals.

At this time, when the duration of irradiating the laser light (duration of irradiating the lower electrode layer 13 with the plasma) is appropriately set, the average thickness of the piezoelectric layer 34 can be adjusted within the aforementioned range. Although this duration of irradiating the laser light varies among the conditions, in general, it is preferably specified to be about 30 to 200 minutes, and more preferably is specified to be about 80 to 100 minutes.

As described above, the piezoelectric layer 34 is produced.

[5C] Lower Electrode Layer Taking-Out

This is performed in a manner similar to that in [5B].

[6C] Upper Electrode Layer Formation

This is performed in a manner similar to that in [6B].

The $SiO_2$ layer 36 can be formed by appropriately setting each condition in the [3C] and/or [4C].

The cantilever 300 is manufactured through [1C] to [6C].

Up to this point, the substrate for an electronic device, the method for manufacturing the substrate for an electronic device, and the electronic device of the present invention have been described with reference to embodiments shown in the drawings. However, the present invention is not-limited to these embodiments.

For example, each portion constituting the substrate for an electronic device and the electronic device of the present invention can be replaced with arbitrary one that exhibits a similar function, or other constituents can be added.

Furthermore, for example, in the method for manufacturing the electronic device of the present invention, arbitrary steps can be added.

EXAMPLES

Next, specific examples of the present invention are described below.

Example 1

The substrate for electronic device shown in FIG. 1 was manufactured as described below.

—0A— A Si (100) substrate was prepared. Regarding this Si (100) substrate prepared, the natural oxidation film had not been removed, and the average thickness of the natural oxidation film was 2 nm.

—1A— The Si (100) substrate was degreased and cleaned.

The Si (100) substrate was immersed in a mixed solvent (solution for removal) of ethyl alcohol and acetone, and degreasing and cleaning were performed while ultrasonic vibration is applied to such a mixed solvent. The mixing ratio of the ethyl alcohol and acetone was set at 1:1 on a volume ratio basis.

—2A— A SrO layer (buffer layer) was formed on the Si (100) substrate.

The Si (100) substrate was mounted on a substrate holder, and the entire substrate holder was placed in a vacuum apparatus at a back pressure of $1\times10^{-8}$ Torr at room temperature.

The Si (100) substrate was heated at 10° C./min using an infrared lamp and the temperature was raised to 700° C.

When the temperature of the Si (100) substrate became 500° C. or more, a part of the natural oxidation film on the Si (100) substrate surface was vaporized as SiO and the pressure in the vacuum apparatus was increased to $1\times10^{-6}$ Torr. However, at the time when the temperature of the Si (100) substrate reached 700° C., the pressure in the vacuum apparatus became a constant value of $5\times10^{-7}$ Torr.

Figure 5:
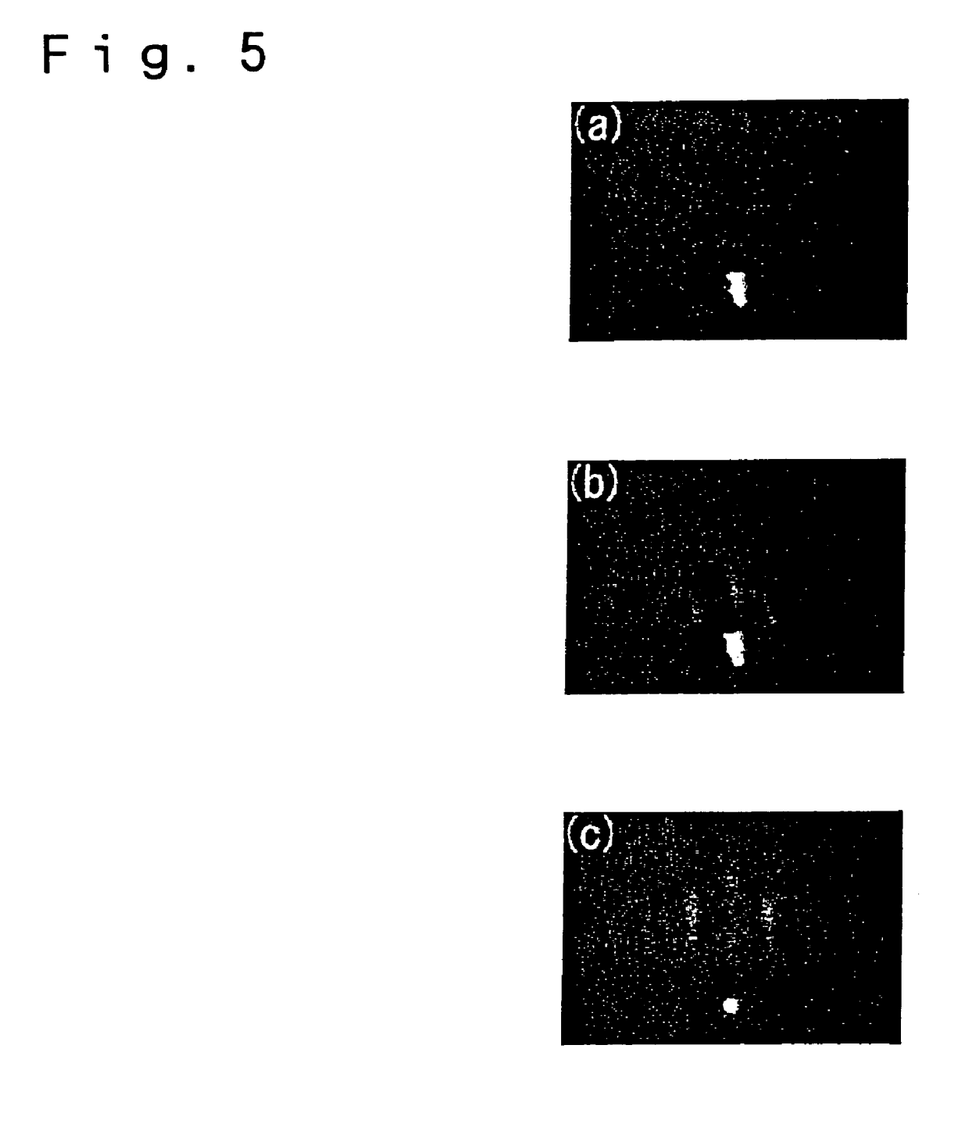
FIGS. 5(a)-5(c) are photographs showing a pattern resulting from an in situ observation of the surface of each layer (each part) in the substrate for an electronic device manufactured in Example 1 by Reflection High Energy Electron Diffraction.

At this time, the surface (top surface) of the Si (100) substrate was observed in situ by Reflection High Energy Electron Diffraction (RHEED), and the resulting pattern is shown in FIG. 5(a). As shown in FIG. 5(a), no diffraction pattern was observed in the RHEED pattern from the Si <011> direction. That is, it was made clear that a reconstruction surface by Si (100) 2×1 was not formed, and the Si (100) substrate was covered with the natural oxidation film.

After the pressure in the vacuum apparatus became constant ($5\times10^{-7}$ Torr), pulsed light (pulse length: 10 ns) of an ArF excimer laser (wavelength: 193 nm) was incident onto the $SrO_2$ target (the first target) surface placed facing the Si (100) substrate (sample) and, therefore, a plasma plume of Sr and O was generated on the $SrO_2$ target surface. The Si (100) substrate was irradiated with plasma plume of these Sr and O and, therefore, a SrO layer having an average thickness of 5 nm was formed. Formation of this SrO layer was performed under the conditions shown below.

ArF excimer laser energy density: 2.4 J/cm² frequency: 1 Hz laser irradiation time: 90 seconds sample temperature: 700° C.

distance between sample and target: 30 mm pressure in vacuum apparatus: $5\times10^{-7}$ Torr At this time, the surface (top surface) of the resulting SrO layer was observed in situ by Reflection High Energy Electron Diffraction (RHEED), and the resulting pattern is shown in FIG. 5(b). As shown in FIG. 5(b), a clear diffraction pattern was observed in the RHEED pattern from the Si <011> direction. That is, it was made clear that the SrO layer brought about epitaxial growth with an orientation relationship SrO (110)/Si (100), SrO <001>//Si <011>.

—3A— A $SrRuO_3$ layer (conductive oxide layer) was formed on the SrO layer.

A $SrRuO_3$ target (the second target) was placed, in place of the $SrO_2$ target, facing the Si substrate (sample), on which the SrO layer had been formed.

Subsequently, pulsed light (pulse length: 10 ns) of an ArF excimer laser (wavelength: 193 nm) was incident onto the $SrRuO_3$ target surface and, therefore, a plasma plume of Sr, Ru, and O was generated on the $SrRuO_3$ target surface. The SrO layer was irradiated with plasma plume of these Sr, Ru, and O and, therefore, a $SrRuO_3$ layer having an average thickness of 100 nm was formed. Formation of this $SrRuO_3$ layer was performed under the conditions shown below.

ArF excimer laser energy density: 2.4 J/cm² frequency: 10 Hz duration of irradiating laser: 30 minutes sample temperature: 550° C.

distance between sample and target: 40 mm partial pressure of oxygen in vacuum apparatus:

$1\times10^{-2}$ Torr (under supply of oxygen gas)

The surface (top surface) of the resulting SrRuO$_3$ layer was observed in situ by Reflection High Energy Electron Diffraction (RHEED), and the resulting pattern is shown in FIG. 5(c). As shown in FIG. 5(c), a clear diffraction pattern was observed in the RHEED pattern from the Si <011> direction. That is, it was made clear that the SrRuO$_3$ layer was pseudo-cubic crystal and-brought about epitaxial growth with an orientation relationship SrRuO$_3$ (100)/SrO (110)/Si (100), SrRuO$_3$ <010>//SrO <001>//Si <011>, in which SrRuO$_3$ is described as a pseudo-cubic system.

Figure 6:
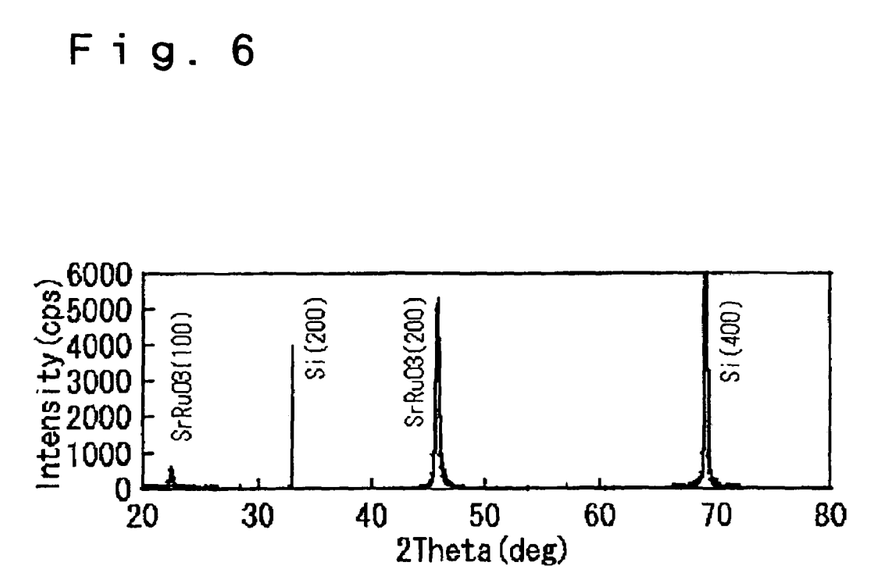
FIG. 6 is a graph showing the analytical result of the surface of the $SrRuO_3$ layer in the substrate for an electronic device manufactured in Example 1 by X-ray Diffraction θ-2θ scan.

The surface (top surface) of the SrRuO$_3$ layer was analyzed by X-ray Diffraction (XRD) θ-2θ scan, and the result thereof is shown in FIG. 6. As shown in FIG. 6, peaks of pseudo-cubic crystal SrRuO$_3$ (100) and SrRuO$_3$ (200) were clearly observed together with peaks of Si (200) and Si (400). This result agreed with the result of the RHEED observation that showed (100) orientation.

Figure 7:
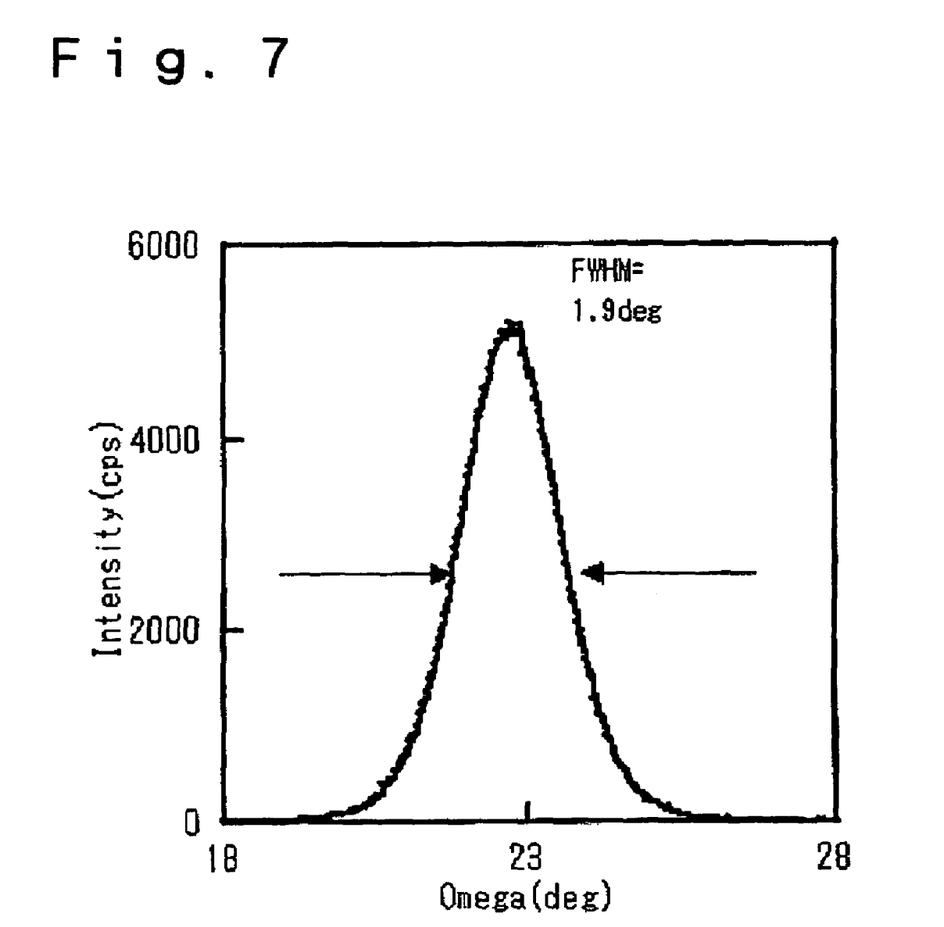
FIG. 7 is a graph showing the analytical result of the $SrRuO_3$ (200) peak shown in FIG. 4 by ω scan.

The SrRuO$_3$ (200) peak was analyzed by ω scan, and the result thereof is shown in FIG. 7. As shown in FIG. 7, the full width at half maximum of the SrRuO$_3$ (200) peak was 1.9, and therefore it was made clear that the crystallinity was also excellent. This result indicated that the SrRuO$_3$ layer was useful as a substrate to epitaxially grow a ferroelectric material having a perovskite structure.

Figure 8:
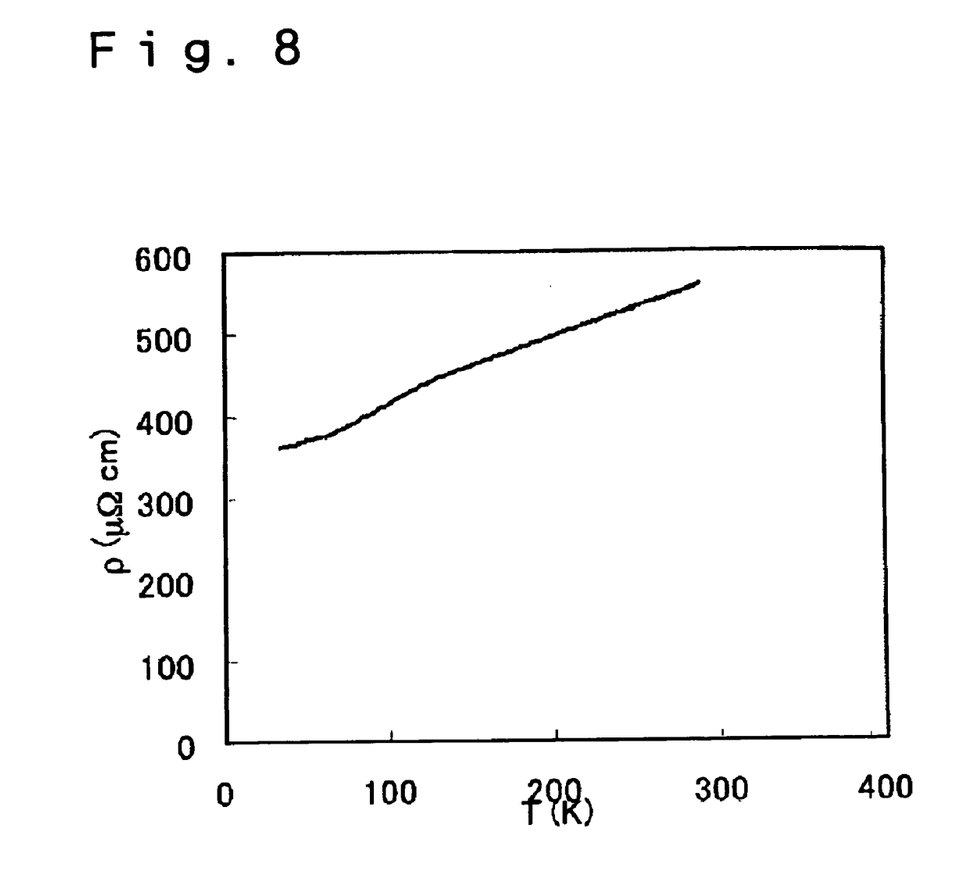
FIG. 8 is a graph showing the measurement result of the electrical resistivity of the $SrRuO_3$ layer in the substrate for an electronic device manufactured in Example 1 by a four-terminal method.

Furthermore, the electrical resistivity of the SrRuO$_3$ layer was measured by a four-terminal method, and the result thereof is shown in FIG. 8. As shown in FIG. 8, the SrRuO$_3$ layer exhibited an excellent value of ρ=550 μΩcm at room temperature, and exhibited metal-like temperature dependency over a wide range of temperatures from 50 K to room temperature. This result indicated that the SrRuO$_3$ layer had basic properties which brought about no problem as an electrode (electrode thin film).

Example 2

The ferroelectric capacitor shown in FIG. 3 was manufactured as described below.

—0B— to —3B— A substrate for an electronic device was produced in a manner similar to those in —0A— to —3A—.

—4B— A Pb(Zr$_{0.3}$Ti$_{0.7}$)O$_3$ (PZT) layer (ferroelectric layer) was formed on the SrRuO$_3$ layer.

A PZT target (the third target) was placed facing the substrate for an electronic device (sample) in place of the SrRuO$_3$ target.

Subsequently, pulsed light (pulse length: 10 ns) of an ArF excimer laser (wavelength: 193 nm) was incident onto the PZT target surface, and therefore a plasma plume of Pb, Zr, Ti, and O was generated on the PZT target surface. The SrRuO$_3$ layer was irradiated with plasma plume of the Pb, Zr, Ti, and O and, therefore, a PZT layer having an average thickness of 150 nm was formed. Formation of this PZT layer was performed under the conditions shown below.

ArF excimer laser
energy density: 1.6 J/cm$^2$
frequency: 10 Hz
duration of irradiating laser: 30 minutes
sample temperature: 600° C.
distance between sample and target: 40 mm
partial pressure of oxygen in vacuum apparatus: 1×10$^{-2}$ Torr (under supply of oxygen gas)

—5B— The SrRuO$_3$ layer was taken out.

This was performed by removing a part of the PZT layer by a photolithography method using a nitric acid-based etchant.

—6B— A Pt electrode (upper electrode layer) having an average thickness of 100 nm was formed on the PZT layer.

A mask layer having an average thickness of 100 nm was formed on the PZT layer by a sputtering method using a pattern.

A Pt layer was formed by evaporation.

Subsequently, the mask layer was removed and then, a Pt electrode was produced.

The resulting ferroelectric capacitor had an orientation relationship Pt/PZT (001)/SrRuO$_3$ (100)/SrO (110)/Si (100), in-plane PZT <010>//SrRuO$_3$ <010>//SrO <001>//Si <011>. That is, it was made clear that the PZT layer was epitaxially grown with tetragonal crystal (001) orientation.

Regarding the resulting ferroelectric capacitor, an electric field having a frequency of 1 kHz and an amplitude of 100 kV/cm was applied and a P-E hysteresis measurement was performed. As a result, regarding this ferroelectric capacitor, the residual dielectric polarization P$_r$ was 90 μC/cm$^2$. This result showed a higher property compared with the 50 μC/cm$^2$ residual dielectric polarization P$_r$ of the ferroelectric capacitor using a non-oriented PZT layer.

Example 3

The piezoelectric thin film cantilever shown in FIG. 4 was manufactured as described below.

—0C— to —3C— A substrate for an electronic device was produced in a manner similar to those in —0B— to —3B— except that the Si (110) substrate was used in place of the Si (100) substrate.

—4C— A Pb(Zr$_{0.7}$Ti$_{0.3}$)O$_3$ (PZT) layer (piezoelectric layer) was formed on the SrRuO$_3$ layer.

A PZT target (the third target) was placed facing the substrate for an electronic device (sample) in place of the SrRuO$_3$ target.

Subsequently, pulsed light (pulse length: 10 ns) of an ArF excimer laser (wavelength: 193 nm) was incident onto the PZT target surface, and therefore a plasma plume of Pb, Zr, Ti, and O was generated on the PZT target surface. The SrRuO$_3$ layer was irradiated with plasma plume of the Pb, Zr, Ti, and O, and therefore a PZT layer having an average thickness of 900 nm was formed. Formation of this PZT layer was performed under the conditions shown below.

ArF excimer laser
energy density: 2.4 J/cm$^2$
frequency: 10 Hz
duration of irradiating laser: 90 minutes
sample temperature: 600° C.
distance between sample and target: 40 mm
partial pressure of oxygen in vacuum apparatus: 1×10$^{-2}$ Torr (under supply of oxygen gas)

In the present step —4C—, a SiO$_2$ layer having an average thickness of 500 nm was formed at the interface with the SrO layer of the Si substrate.

—5C— This was performed in a manner similar to that in —5B—.

—6C— An Ir electrode (upper electrode layer) was formed in a manner similar to that in —6B— except that Ir was used in place of Pt.

The resulting piezoelectric thin layer cantilever had an orientation relationship Ir/PZT (100)/SrRuO$_3$ (100)/SrO (110)/SiO$_2$/Si (110), in-plane PZT <010>//SrRuO$_3$ <010>//SrO <001>//Si <001>. That is, it was made clear that the PZT layer was epitaxially grown with rhombohedral crystal (100) orientation.

Regarding the resulting piezoelectric thin layer cantilever, an electric field having a frequency of 1 kHz and an amplitude of 100 kV/cm was applied, and a measurement of an electric field strain property was performed. As a result, regarding this piezoelectric thin layer cantilever, the piezoelectric constant $d_{31}$ was 200 pC/N. This result showed that this piezoelectric thin layer cantilever had a higher electric field strain property as a piezoelectric element compared with that of the piezoelectric thin layer cantilever using a non-oriented PZT layer, which had the piezoelectric constant $d_{31}$ of 160 pC/N. This is considered to be an effect of the engineered domain in which the piezoelectric effect is increased when the angles between polarization axes of individual domains of the PZT layer (piezoelectric layer) and the electric field become the same.

[Advantages]

As described above, according to the present invention, since the buffer layer which is formed by epitaxial growth and which contains a metal oxide having a NaCl structure is installed on the Si substrate, a conductive oxide layer containing a metal oxide having a perovskite structure can be formed on this buffer layer by epitaxial growth with cubic crystal (100) orientation or pseudo-cubic crystal (100) orientation.

That is, according to the present invention, a substrate for an electronic device including the conductive oxide layer which is formed by epitaxial growth with cubic crystal (100) orientation or pseudo-cubic crystal (100) orientation and which contains the metal oxide having a perovskite structure can be provided.

Furthermore, by using such a substrate for an electronic device, an electronic device having various excellent properties can be realized with an optimum structure.

What is claimed is:

1. A method for manufacturing a substrate for an electronic device, comprising:
   cleaning a Si substrate;
   forming a buffer layer containing a metal oxide having a NaCl structure by epitaxial growth, in which after the Si substrate is cleaned, the Si substrate in a vacuum apparatus is irradiated with plasma containing oxygen plasma and metal element plasma; and
   forming a conductive oxide layer containing a metal oxide having a perovskite structure by epitaxial growth with at least one of cubic crystal (100) orientation and pseudo-cubic crystal (100) orientation, in which after the buffer layer is formed, the buffer layer in a vacuum apparatus is irradiated with plasma containing oxygen plasma and metal element plasma.

2. The method for manufacturing a substrate for an electronic device according to claim 1, the cleaning the Si substrate includes cleaning the Si Substrate without producing at least one of a reconstructed surface and a hydrogen-terminated surface.

3. The method for manufacturing a substrate for electronic device according to claim 2, the forming the buffer layer includes growing the buffer layer epitaxially while a natural oxidation film on the Si substrate surface is removed by irradiating the Si substrate selectively with the metal element plasma rather than the oxygen plasma.

4. The method for manufacturing a substrate for an electronic device according to claim 1, the forming a buffer layer including forming a buffer layer containing a metal oxide having a NaCl structure that is at least one of MgO, CaO, SrO, BaO, and a solid solution containing at least one of MgO, CaO, SrO, and BaO.

5. The method for manufacturing a substrate for an electronic device according to claim 1, the forming a buffer layer including growing the buffer layer epitaxially with cubic crystal (110) orientation.

6. The method for manufacturing a substrate for an electronic device according to claim 1, the forming a buffer layer including forming a buffer layer that has an average thickness of 10 nm or less.

7. The method for manufacturing a substrate for an electronic device according to claim 1, the forming a buffer layer including forming a buffer layer containing a metal oxide having a perovskite structure that is at least one of $CaRuO_3$, $SrRuO_3$, $BaRuO_3$, and a solid solution containing at least one of $CaRuO_3$, $SrRuO_3$, and $BaRuO_3$.

8. The method for manufacturing a substrate for an electronic device according to claim 1, further including generating plasma using laser light.

* * * * *